(12) United States Patent
Engelhardt et al.

(10) Patent No.: US 9,219,011 B2
(45) Date of Patent: Dec. 22, 2015

(54) SEPARATION OF CHIPS ON A SUBSTRATE

(71) Applicant: Infineon Technologies AG, Neubiberg (DE)

(72) Inventors: Manfred Engelhardt, Villach-Landskron (AT); Gudrun Stranzl, Goedersdorf (AT); Markus Zundel, Egmating (DE); Hubert Maier, Villach (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 14/013,822

(22) Filed: Aug. 29, 2013

(65) Prior Publication Data

US 2015/0064879 A1    Mar. 5, 2015

(51) Int. Cl.
*H01L 21/00* (2006.01)
*H01L 21/30* (2006.01)
*H01L 21/46* (2006.01)
*H01L 21/78* (2006.01)
*B28D 5/00* (2006.01)

(52) U.S. Cl.
CPC . *H01L 21/78* (2013.01); *B28D 5/00* (2013.01)

(58) Field of Classification Search
CPC ............... H01L 21/6835; H01L 21/78; H01L 2221/68327; H01L 21/58; H01L 2924/151

USPC ............... 438/110, 113, 458, 459, 460, 462; 257/E21.602, E21.499, E21.529
See application file for complete search history.

(56) References Cited

U.S. PATENT DOCUMENTS

| 7,129,114 | B2 | 10/2006 | Akram |
| 7,459,378 | B2 | 12/2008 | Genda et al. |
| 8,361,884 | B2 | 1/2013 | Engelhardt |
| 8,507,363 | B2 | 8/2013 | Lei et al. |
| 2006/0043534 | A1* | 3/2006 | Kirby et al. ............ 257/618 |
| 2009/0057885 | A1* | 3/2009 | Theuss .................. 257/723 |
| 2012/0040510 | A1 | 2/2012 | Yoo |
| 2013/0115736 | A1 | 5/2013 | Brunner et al. |
| 2013/0115755 | A1 | 5/2013 | Engelhardt et al. |
| 2013/0115757 | A1 | 5/2013 | Engelhardt et al. |

FOREIGN PATENT DOCUMENTS

WO      2013019499 A2    2/2013

* cited by examiner

*Primary Examiner* — Mohsen Ahmadi
(74) *Attorney, Agent, or Firm* — Slater & Matsil, L.L.P.

(57) ABSTRACT

Various methods and apparatuses are provided relating to separation of a substrate into a plurality of parts. For example, first a partial separation is performed and then the partially separated substrate is completely separated into a plurality of parts.

12 Claims, 7 Drawing Sheets

SEPARATION OF CHIPS ON A SUBSTRATE

TECHNICAL FIELD

The present application relates to the separation of a substrate, for example, to obtain separate chip dies.

BACKGROUND

When manufacturing semiconductor devices, usually a plurality of chips is manufactured on a single wafer. For example, typical semiconductor wafers used as substrates in a manufacturing process may have a diameter of 100 mm or more, e.g., 300 mm or more, and typical chip dimensions may be in the order of 100 µm up to some millimeters. Therefore, a plurality of chips can be formed on a single wafer, increasing manufacturing yield.

In such a manufacturing process, prior to obtaining the final product the chips on the wafer have to be separated from each other, resulting in a plurality of chip dies, also simply referred to as dies. These dies may then, for example, be individually packaged and contacted electrically to obtain final products.

In particular, with thin wafers having a metallization on at least one side thereof the quality of this separation sometimes is critical. For example, with some conventional separation processes fine cracks may occur in side walls of the individual chip dies which may later lead to reliability problems. Also, for example, when mechanical sawing techniques are used for separation, broad kerfs or scribe lines, typically of the order of 70 µm, are required due to a width of the sawing blade. Such mechanical sawing may also lead to crack formation.

On the other hand, when chip separation is performed using so-called plasma dicing, the metallization of the wafer may cause problems. In particular, metallizations often comprise a stack of different metals which may require the use of different etchants in addition to plasma dicing applied to semiconductor material of the substrate, thus making the process difficult.

Figure 1:
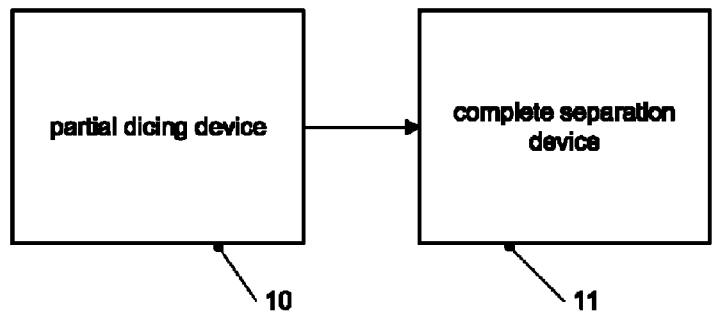
FIG. 1 is a block diagram illustrating an apparatus according to an embodiment.

In the following, embodiments will be described in detail referring to the attached drawings. The embodiments shown in the drawings or described herein are to be seen as examples only and are not to be construed as limiting the scope of the present application, as other embodiments may be implemented in other ways than shown without departing from the scope of this application. For example, describing an embodiment with a plurality of features is not to be construed as indicating that all such features are essential for implementing embodiments. Instead, in other embodiments, some features may be omitted, features may be replaced by alternative features and/or features may be added. Also, features may be arranged in a different temporal or spatial order compared to the one shown. Features of different embodiments may be combined with each other unless noted otherwise.

DETAILED DESCRIPTION OF ILLUSTRATIVE EMBODIMENTS

Embodiments discussed in the following relate to processing of substrates. The term substrate herein may refer to a processed substrate, for example, a substrate where semiconductor structures are formed on the substrate and/or metallization layers have been applied to the substrate, or to an unprocessed substrate. In particular, embodiments described in the following relate to separation of a substrate into a plurality of dies. This separation is also referred to as dicing herein.

Some embodiments discussed hereinafter employ a partial dicing. Partial dicing refers to techniques, devices or operations where only part of material(s) between dies to be formed from the substrate is removed. For example, grooves or trenches may be formed between chips which do not extend all the way through the material between the chips, for example, a semiconductor material like a wafer and/or a metallization.

In FIG. 1, a block diagram illustrating an apparatus according to an embodiment is shown. The apparatus of FIG. 1 in some embodiments is part of a system or apparatus for substrate processing. In other words, additional devices, apparatuses etc. may be employed to perform additional substrate processing to the substrate processing performed by the apparatus of FIG. 1 discussed in the following. It should be noted that in the context of this application the term "apparatus" does not imply any specific spatial relationship between the various devices forming the apparatus. For example, different devices may be provided in different rooms, different buildings or other kinds of different locations, substrates being transported between the devices. Also, a device may comprise several sub-devices which may be located adjacent to each other or remote from each other. Various devices of the embodiments may be combined into a single device. In other words, depicting two or more devices as separate blocks does not imply that these devices have to be implemented in a spatially separate manner.

In the embodiment of FIG. 1, the apparatus comprises a partial dicing device 10 and a complete separation device 11. In the embodiment of FIG. 1, substrates, for example substrates comprising semiconductor wafers like silicon wafers, are first partially diced by partial dicing device 10. Following the partial dicing, the individual chip dies or other substrate parts are completely separated in complete separation device 11. It should be noted that between devices 10 and 11 further devices to perform substrate processing, for example, any conventional kind of semiconductor substrate processing, may be provided.

Partial dicing apparatus 10 may, for example, use a plasma dicing technique or a mechanical sawing technique to perform the partial dicing. Complete separation device 11 may, for example, mechanically separate the chip dies or other desired substrate parts from each other. For example, the partially diced substrate may be mounted to an expansion tape. The tape may then be expanded, resulting in a mechanical separation. Other kinds of mechanical separation, for example water beams, or other techniques like laser beam techniques may also be employed to perform the complete separation.

Figure 2:
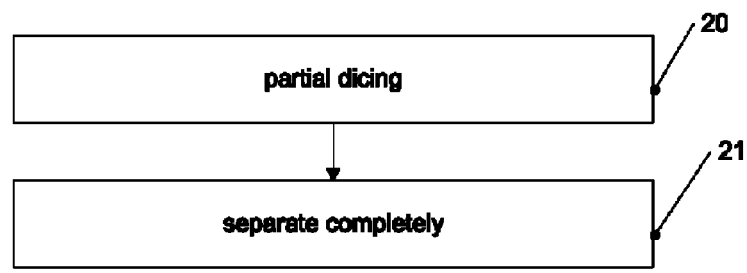
FIG. 2 is a flowchart illustrating a method according to an embodiment.

In FIG. 2, a flowchart illustrating a method according to an embodiment is shown. The method of FIG. 2 may be implemented using the apparatus of FIG. 1, but may also be implemented using other apparatuses or devices. It should be noted that further to the operations and techniques described with reference to FIG. 2, further techniques or operations may be employed before, after or between the operations and techniques explicitly described.

At 20 in FIG. 2, a partial dicing of a substrate is performed, that is material between chips or other substrate parts to be separated is partially removed. In some embodiments, the partial dicing is performed by sawing or plasma dicing. In some embodiments, partially removing the material involves partially removing semiconductor material, leaving semiconductor material "bridges" between the chips. In other embodiments, partially removing the material involves completely removing semiconductor material between the chip leaving, for example, only a metallization like a backside metallization connecting the chips.

At 21, a complete separation of the chips into chip dies is performed, for example, by a mechanical treatment, a particle beam treatment like a water beam treatment or by a laser beam treatment. In case a mechanical treatment is used, the partially diced substrate may, e.g., be mounted to an expansion tape which then is expanded to mechanically separate the chip dies from each other.

Figure 3:
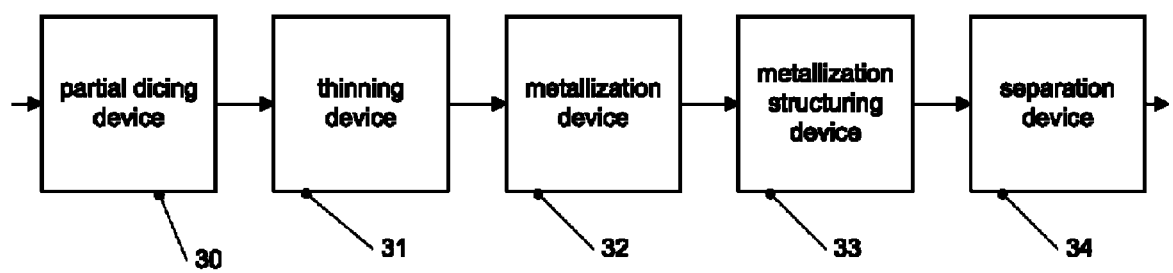
FIG. 3 is a block diagram illustrating an apparatus according to an embodiment.

In FIG. 3, a block diagram illustrating a substrate processing apparatus according to an embodiment is shown. As for the embodiment of FIG. 1, while a plurality of devices are shown in FIG. 3, additional devices may be provided to process substrates prior to being provided to the apparatus of FIG. 3, after leaving the apparatus of FIG. 3 or in between being processed by various devices shown in FIG. 3.

The apparatus of FIG. 3 comprises a partial dicing device 30 for partially dicing substrates to be processed, i.e., partially removing material between chips or other relevant parts on the substrate. In the embodiment of FIG. 3, the partial dicing may comprise forming grooves or trenches in comparatively thick semiconductor wafers, for example wafers being about 600-700 μm thick. The partial dicing may be performed, for example, employing plasma dicing or mechanical methods like sawing using a wire saw. Trenches or grooves formed in this way may have a depth between 20 μm and 100 μm, for example, between 30 μm and 40 μm, but are not limited thereto.

Following the partial dicing, the substrates are provided to a thinning device 31 thinning the substrate. For example, for thinning semiconductor-based substrates, any conventional grinding and/or polishing techniques used in semiconductor processing may be used. The thinning may involve removing material from a side of the wafer opposite to the side where the grooves or trenches are formed in partial dicing device 30.

Following the thinning, the substrate in the embodiment of FIG. 3 is provided to a metallization device which may be used to provide a backside metallization to the substrate. In particular, the metallization may be applied to the side of the substrate opposite the side where the grooves or trenches are formed in partial dicing device 30.

Following metallization in metallization device 32, in the embodiment of FIG. 3 the substrate is provided to a metallization structuring device 33 which structures the metallization corresponding to the partial dicing, in particular removes metallization corresponding to the location of the trenches or grooves provided by partial dicing device 30. In other embodiments, metallization structuring device 33 may be omitted.

After the structuring of the metallization in metallization structuring device 33, the substrate is provided to a separation device 34 where a complete separation of the chip dies or other desired parts of the substrate is performed, for example by mechanical means like the use of an expansion tape, by a particle beam like a water beam or by radiation like laser radiation.

Figure 4:
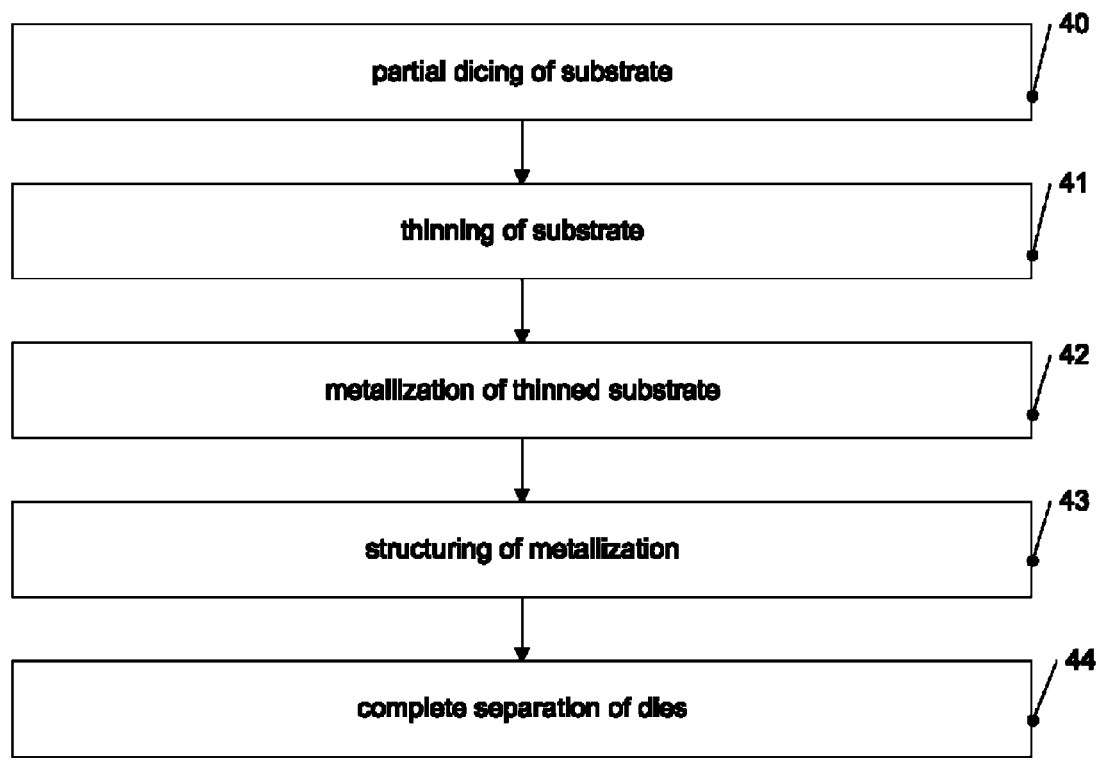
FIG. 4 is a flowchart illustrating a method according to an embodiment.

In FIG. 4, a flowchart illustrating a method according to an embodiment is shown. The method of FIG. 4 may, for example, be implemented using the apparatus of FIG. 3, but may also be implemented using other apparatuses or devices. Before, after or between the operations and techniques described with reference to FIG. 4, other operations or techniques may be applied to the substrate.

At 40, a partial dicing of a substrate is performed. The substrate may comprise a comparatively thick semiconductor wafer, for example with a thickness between 600 μm and 700 μm or more, and may comprise providing trenches or grooves in one side of the substrate. A depth of the trenches or grooves may be between 20 μm and 100 μm, for example between 30 μm and 40 μm.

At 41, the substrate is thinned, for example, by material removal from a side opposite the trenches or grooves formed at 40. For thinning the substrate, any conventional technique like grinding and/or polishing may be applied.

At 42, a metallization is applied to the thinned substrate, for example, a metallization comprising a plurality of metal layers. The metallization may be provided on a side of the substrate opposing the trenches or grooves formed at 40.

At 43, optionally the metallization is structured. For example, portions of a blanket metallization are removed at locations corresponding to the positions of the trenches or grooves formed at 40. Structuring the metallization may, for example, comprise etching the metallization with one or more etchants, with a plasma treatment or any other conventional metal removal techniques.

At 44, the chip dies or other relevant parts of the substrate are completely separated from each other, for example by applying mechanical force, for example, using an expansion tape, by using a particle beam like a water beam or by using laser radiation.

The embodiments of FIGS. 3 and 4 merely serve as one implementation example of an embodiment, and other implementations may equally be used. For example, instead of the metallization of the thinned substrate and the structuring of metallization described above, a backside to be metallized may be covered with imide or photoresist, which imide or photoresist may be structured such that imide or photoresist remains in a kerf area, i.e., an area where the separation should be performed and where the trenches or grooves are provided, for example at 40. Then, a metal may be sputtered on the backside, and the metal may be planarized stopping at the imide or photoresist such that no metal remains in the kerf area. Optionally, the imide or photoresist may then be removed. In an alternative embodiment, using an imide or similar substance a metal lift-off process may be performed in the kerf region. In other embodiments, imide and metal may remain on the substrate, and the separation at 44 may separate remaining substrate material, metallization and imide.

The embodiment of FIGS. 3 and 4 in some cases may result in side walls of higher quality than conventional methods, in particular as the partial dicing is performed prior to the thinning which reduces vibrations etc. during sawing or other dicing techniques. In other embodiments, the thinning at 41 may be performed prior to the partial dicing at 40.

Next, to further illustrate the embodiments of FIGS. 3 and 4, semiconductor substrates in various stages of processing will be discussed with reference to FIGS. 5A-5F. In particular, FIGS. 5A-5F show schematic cross-sectional views of substrates as they may occur in different devices of the embodiment of FIG. 3 or at different instances of the method of FIG. 4. However, these cross-sectional views are merely illustrative examples, and in other implementations other structures than the ones shown may result. Moreover, various elements in FIGS. 5A-5F are not drawn to scale with each other, but are provided to clearly illustrate some features of some implementations of the embodiments of FIGS. 3 and 4.

Figure 5A:
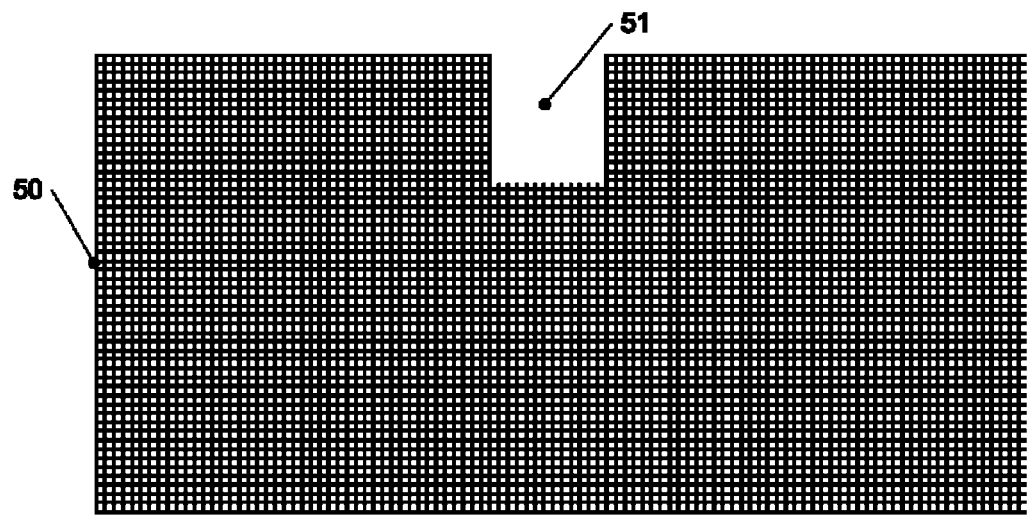
FIGS. 5A-5F are schematic representations of a substrate in various stages of processing, for illustrating embodiments.

In FIG. 5A a part of a semiconductor wafer 15, for example, a processed semiconductor wafer with semiconductor structures or devices formed thereon, is shown. Semiconductor wafer 15 may have a thickness of about 600-700 µm, but is not limited thereto. Between chip dies to be separated, a partial dicing is performed, resulting in grooves like groove 51 of FIG. 5A. In other words, material is removed up to a certain depth, e.g., a depth between 20 µm and 100 µm, for example, between 30 µm and 40 µm, from wafer 50. For example, the locations where the material is removed may correspond to scribe lines or kerf regions of the wafer. The kerf area may be completely free of structures and other materials like metals and therefore consist of pure semiconductor material, for example pure silicon. The removal of material may, for example, be performed using partial dicing device 30 of FIG. 3 or may be performed at 40 of FIG. 4 and may be performed, for example, using plasma dicing or mechanical sawing. The direction of groove or trench 51 may be selected such that the kerf regions break in the direction of a natural break of the respective substrate material, for example silicon.

Figure 5B:
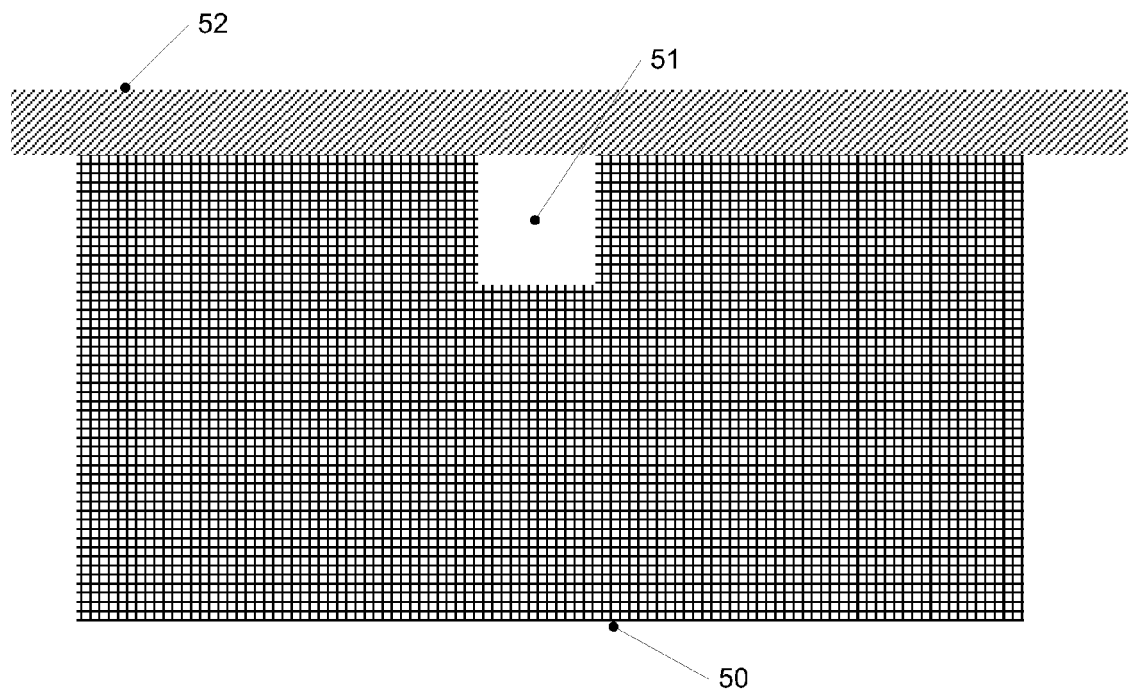
Figure 5C:
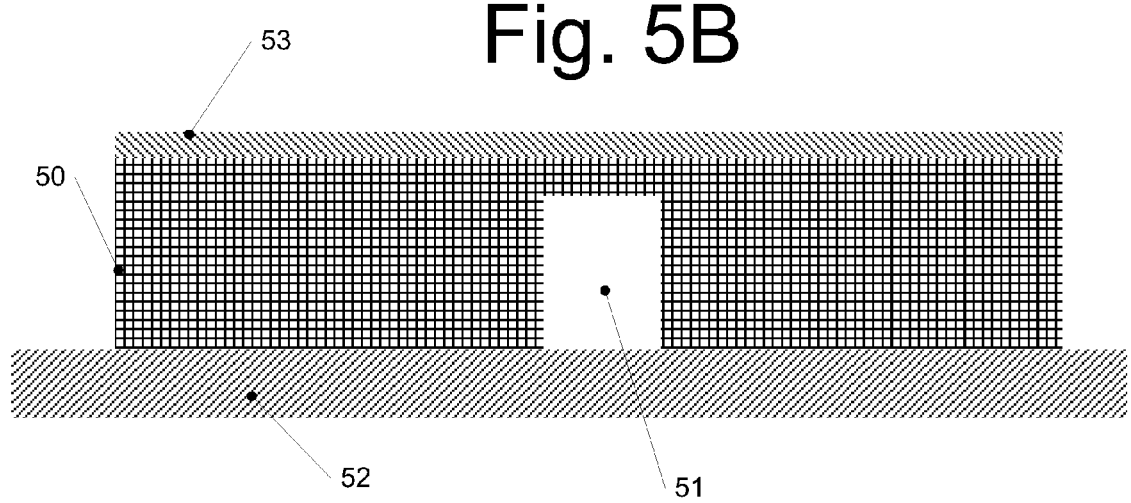
Figure 5D:
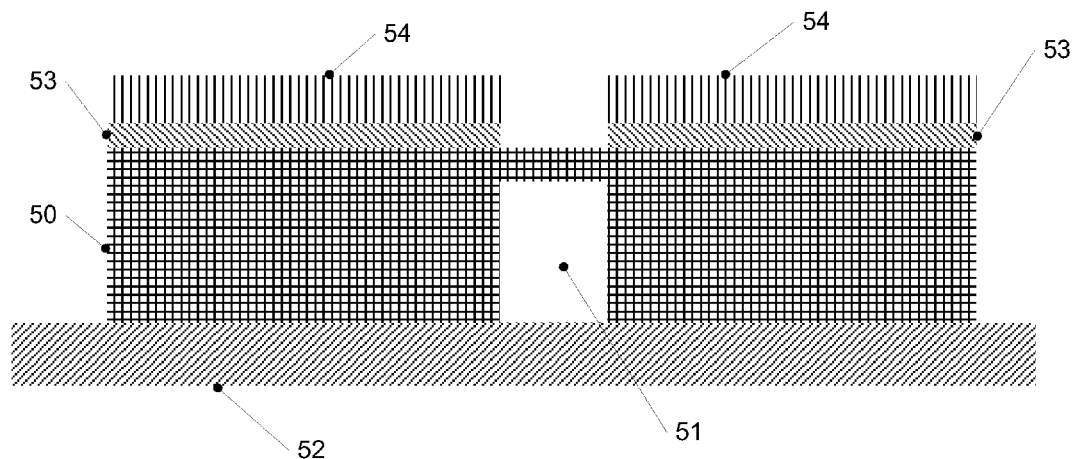

After the partial dicing, as shown in FIG. 5B the wafer 50 is mounted to a carrier 52, for example using an adhesive tape or other conventional mounting technique. Mounted on the carrier, the backside of wafer 50 (the side opposite the side of groove 51) is thinned, for example down to a thickness of 50 µm substrate thickness, and metallized. These operations may, for example, be performed in thinning device 31 and metallization device 32 of FIG. 3 or at 41 and 42 in FIG. 4. The result is shown in FIG. 5C, where compared to the representation of FIG. 5B the wafer is shown "upside down," i.e., with the carrier 52 below wafer 50. However, the actual orientation of the wafer 50 or other substrate may depend on the actual implementation of the various devices used.

The result is shown in FIG. 5C. Here, a metallization 53 is provided on thinned wafer 50 to form a metallized substrate.

Next, the metallization is structured, leading in particular to a removal of the metal in the region of groove 51. This may, for example, be performed using metallization structuring device 33 of FIG. 3 or may be performed at 43 of FIG. 4. To illustrate, in FIG. 5D a structured material 54 like a photoresist is applied to metallization 53 and removed at the regions of groove 51. A subsequent etching removes metallization 53 at the groove 51, whereas the remaining metallization is protected by material 54. Various kinds of wet etching or plasma etching may, for example, be used to structure metallization 53.

Figure 5E:
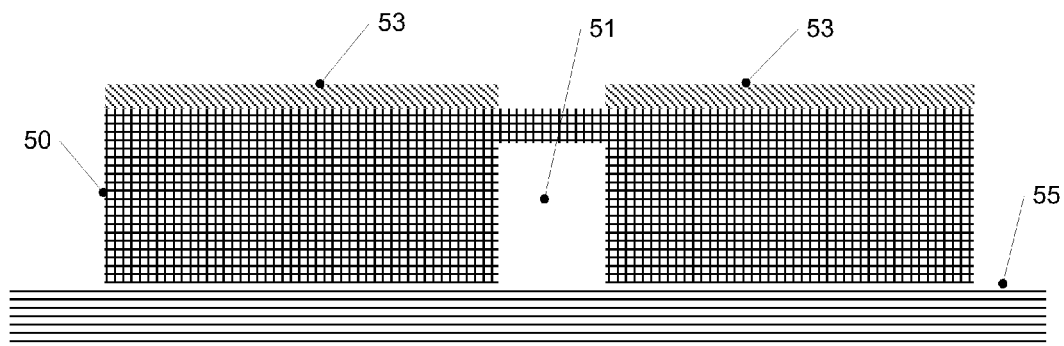
Figure 5F:
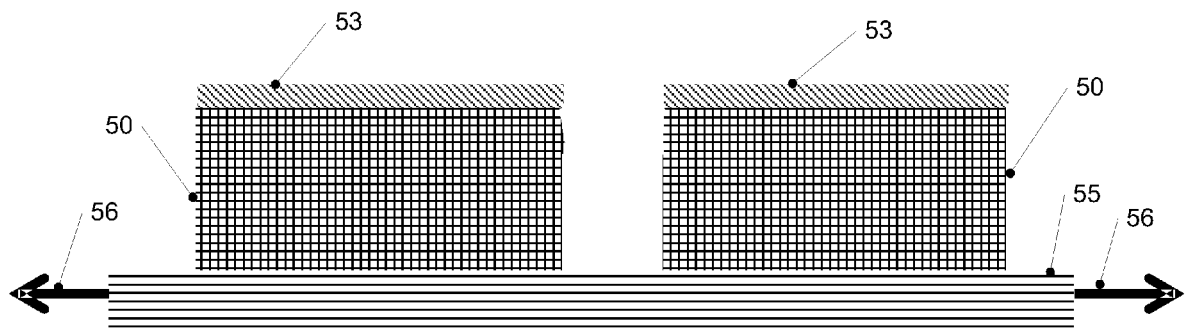

After the metallization has been structured, material 54 may be removed, for example, by using a corresponding solvent, and for the final separation, substrate 50 is, for example, mounted to an expansion tape 55, as shown in FIG. 5E. As mentioned above, other techniques for separation than an expansion tape may also be used. Then, as indicated in FIG. 5F, expansion tape 55 is expanded as indicated by arrows 56, leading to a breaking of the "bridge" of wafer material above groove 51 in FIG. 5E. Before the separation, the bridges of semiconductor material in some embodiments may be slightly slit, for example to a depth of 2-5 µm, using a plasma etch or a mechanical sawing to facilitate breaking of the bridges when expanding the expansion tape. As shown in FIG. 5F, this leads to two separated wafer portions 50, for example two separate chip dies. It should be noted that two chip dies are merely shown for simplification purposes, and a plurality of chip dies depending on the size of the wafer and the number of chips formed on the wafer may be present.

It should be noted that in some cases part of the "bridge" mentioned above may adhere to one of the chips and may be removed for example using a material removal technique as will be described later with reference to FIG. 8E. The bridge easily breaks in embodiments where the grooves like groove 51 are orientated corresponding to preferred breaking directions of the respective wafer used, for example a silicon wafer.

Figure 6:
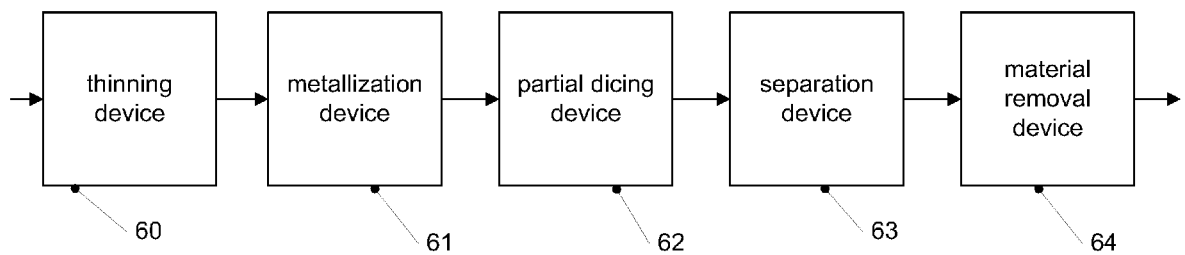
FIG. 6 is a block diagram illustrating an apparatus according to an embodiment.

Next, a further embodiment of an apparatus will be described with reference to FIG. 6. In particular, FIG. 6 shows a block diagram of an apparatus according to an embodiment comprising various devices. It is to be noted that prior to being processed by the devices of FIG. 6, after being processed by the devices of FIG. 6 or between being processed by various devices of FIG. 6 substrates may be processed by additional devices which are not shown in FIG. 6, for example conventional devices used for semiconductor processing. For example, prior to being processed by the devices of FIG. 6, semiconductor structures or devices may be formed on a substrate like a semiconductor wafer by any conventional techniques.

In the apparatus of FIG. 6 a substrate, for example, a processed semiconductor wafer like a processed silicon wafer, is provided to a thinning device 60 where the wafer is thinned to a target thickness, for example a thickness of about 50-70 µm, although other thicknesses are also possible depending on the application. The thinning may, for example, be performed by applying conventional grinding and/or polishing techniques.

After the thinning, the substrate is provided to a metallization device 61 where a backside metallization is applied to the substrate, i.e., a metallization on a side of the substrate opposite a side where, for example, semiconductor structures or semiconductor devices are formed.

Applying a metallization as already discussed may comprise subsequently applying a plurality of metal layers to the backside of the substrate.

Following metallization in metallization device 61, the substrate is provided to a partial dicing device performing a partial dicing. In the embodiment of FIG. 6, the partial dicing may comprise a complete removal of semiconductor materials between chips to be formed, leaving only the metallization formed in metallization device 61 connecting the chips with each other. In other embodiments, a thin bridge of semiconductor material as discussed with reference to FIGS. 5A-5F may be left.

Following the partial dicing, the substrate is provided to a separation device 63 to perform a complete separation of the chip dies or other relevant parts of the substrate. For example, the substrate may be mounted to an expansion tape, which is then expanded.

After separation, the substrate may be provided to a material removal device 64 which is used to remove excess material, for example excess metal, as will be described using an example later with reference to FIG. 8E.

Next, with reference to FIG. 7 a method according to a further embodiment will be described. The method illustrated in FIG. 7 may be implemented using the apparatus shown in FIG. 6, but may also be implemented using other apparatuses or devices.

Furthermore, prior to the various operations and techniques described with reference to FIG. 7, between these operations or techniques and/or after these operations or techniques further operations and techniques may be applied to a substrate like a semiconductor-based substrate, for example any conventional processing techniques employed in manufacturing processes of semiconductor devices.

At 70, a substrate, for example a semiconductor like a silicon wafer, is thinned to a desired target thickness. The substrate may be a preprocessed substrate, for example a semiconductor wafer with semiconductor structures or devices formed thereon.

At 71, a metallization is applied to a backside of a substrate, i.e., a side opposite a side where semiconductor structures or other elements are formed on the substrate. The metallization may comprise several layers, each layer comprising a metal or a metal alloy.

At 72, a partial dicing of the metallized substrate is performed. For example, in case of a substrate comprising a semiconductor wafer, semiconductor material between chip dies to be formed may be completely removed, for example using plasma dicing, such that the chip dies remain interconnected only via the metallization applied at 71.

At 73, the chip dies or other relevant parts of the substrate are then completely separated from each other. For example, after the partial dicing at 72 the substrate may be mounted to an expansion tape, and an expansion of the expansion tape may then tear the metallizations between the dies, thus completely separating the dies from each other.

At 74, then excess material, in particular excess metal, is removed for example using a so-called $CO_2$ snow-jet, which ejects small particles of dry ice, i.e., frozen $CO_2$.

To further illustrate the embodiments discussed above with reference to FIGS. 6 and 7, in FIGS. 8A-8E various schematic cross-sectional views of a substrate in various stages of processing are shown. The representations of FIGS. 8A-8E are to be regarded as schematic only, and various elements of these Figures are not necessarily drawn to scale with each other, but are depicted in a manner to give a clear understanding of the respective illustrated substrate. Moreover, the schematic representations of FIGS. 8A-8E illustrate merely one of numerous possibilities how substrates may look like in various stages of processing, and in other implementations of the embodiments of FIGS. 6 and 7 other substrates may be obtained.

Figure 7:
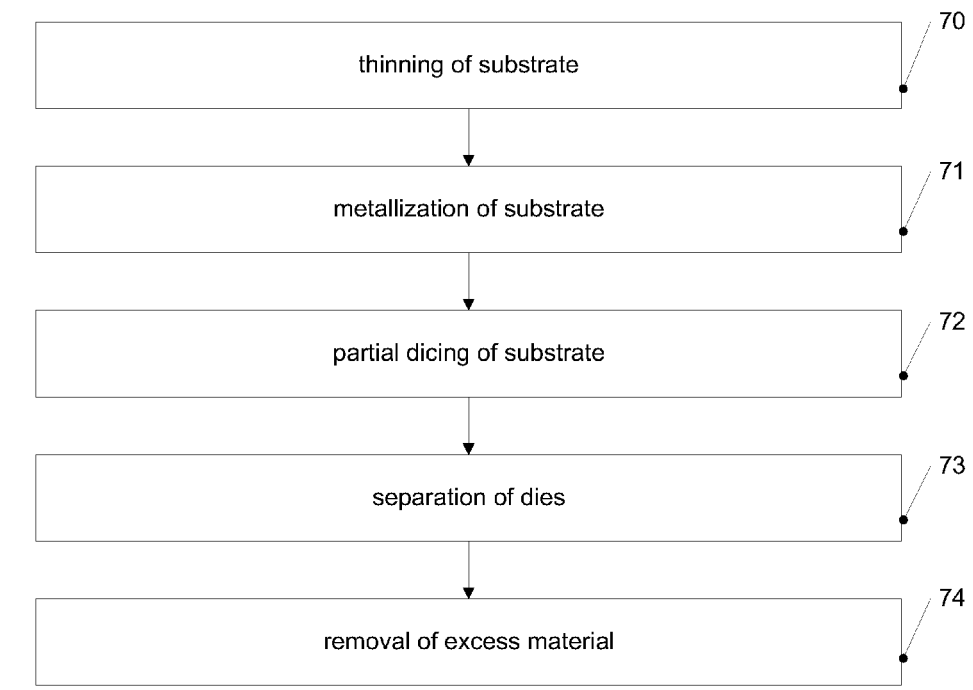
FIG. 7 is a flowchart illustrating a method according to an embodiment.
Figure 8A:
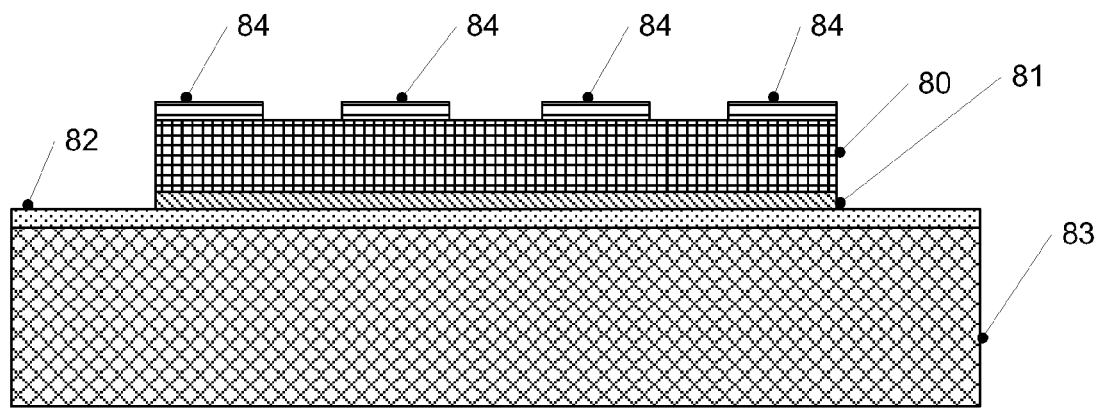
FIGS. 8A-8E are schematic representations of a substrate in various stages of processing, for illustrating embodiments.

In FIG. 8A, a schematic cross-sectional view of a substrate after a thinning and applying a metallization is shown, for example a substrate after having been processed by thinning device 60 and metallization device 61 of FIG. 6 or after having undergone the operations described with reference to 70 and 71 of FIG. 7. In the illustrative example of FIG. 8A, the substrate comprises a semiconductor wafer 80 having a metallization 81 on a backside thereof. The substrate is mounted to a carrier 83 via an adhesive tape 82. In preparation for a partial dicing, a mask 84 has been applied to a front side of the wafer 80, for example using conventional photolithography. Mask 84 in the example of FIG. 8A covers areas corresponding to chip dies to be separated from each other, leaving free kerf regions or scribe lines at which the chip dies are to be separated. In the illustrative example of FIG. 8A, wafer 80 has been thinned prior to applying metallization 81, for example thinned to a thickness of between 50 and 150 μm, for example about 50 μm.

Figure 8B:
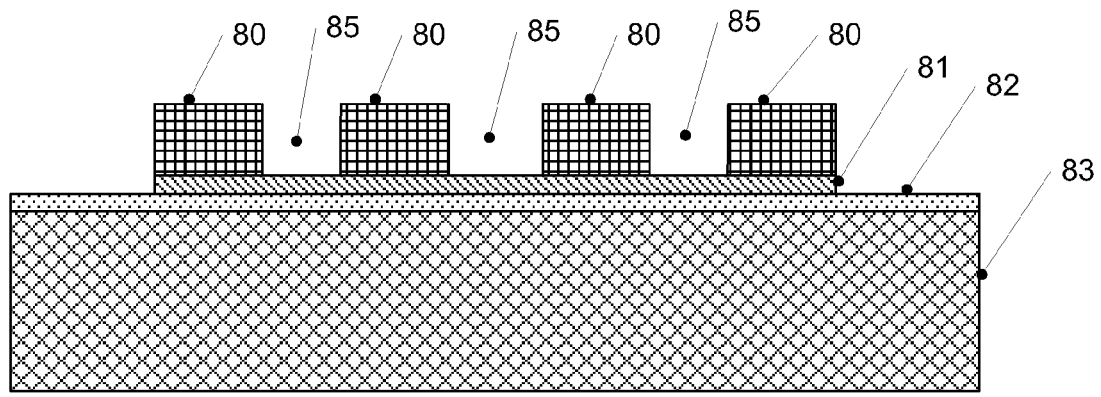

FIG. 8B shows a schematic cross-sectional view of the arrangement of FIG. 8 after a partial dicing has been performed, for example using partial dicing device 62 of FIG. 6 or at 72 of FIG. 7. In the illustrative example of FIG. 8B, using partial dicing at locations indicated with 85 in FIG. 8B the material of semiconductor wafer 80 has been completely removed, for example using plasma dicing. Therefore, the various chip dies of wafer 80 remain only connected via backside metallization 81.

Figure 8C:
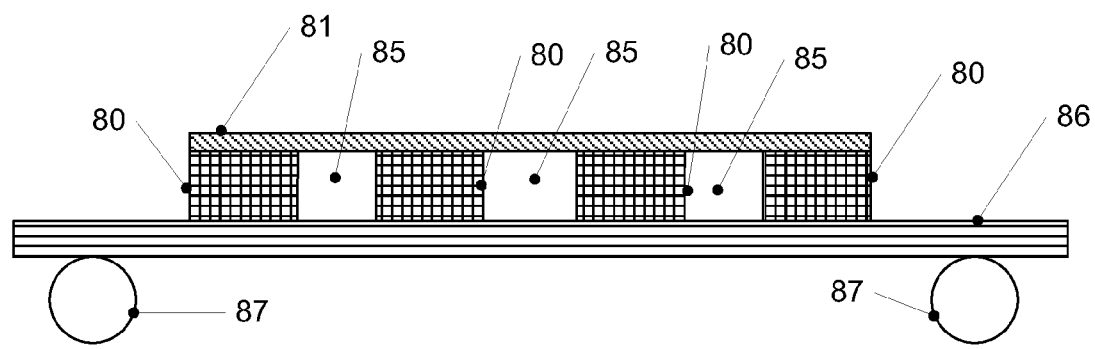

Next in the illustrative example currently discussed, the substrate is mounted to an expansion tape 86 as shown in FIG. 8C, for example in separation device 63 of FIG. 6 or at 73 of FIG. 7. With 87, holders for expansion tape 86 are denoted. In order to separate the different chip dies (also for example in separation device 63 of FIG. 6 or at 73 of FIG. 7), the expansion tape is then expanded as indicated by arrows 810 in FIG. 8D, thus tearing metallization 81 which results in a plurality of separated chip dies. While four such chip dies are shown in FIG. 8D for illustrative purposes, any number of chip dies can result, in particular significantly greater numbers than four, depending on the size of the wafer 80 and the size of the individual chips to be formed thereon.

Figure 8D:
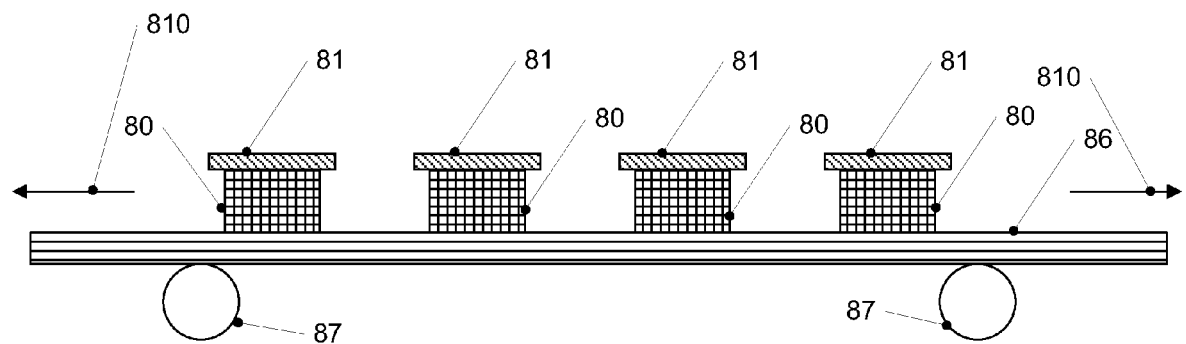

As can be seen in FIG. 8D, metallization 81 may have portions overhanging the chip dies formed by wafer 80. To remedy this, overhanging metallization may be removed, for example, in material removal device 64 of FIG. 6 or at 74 of FIG. 7.

Figure 8E:
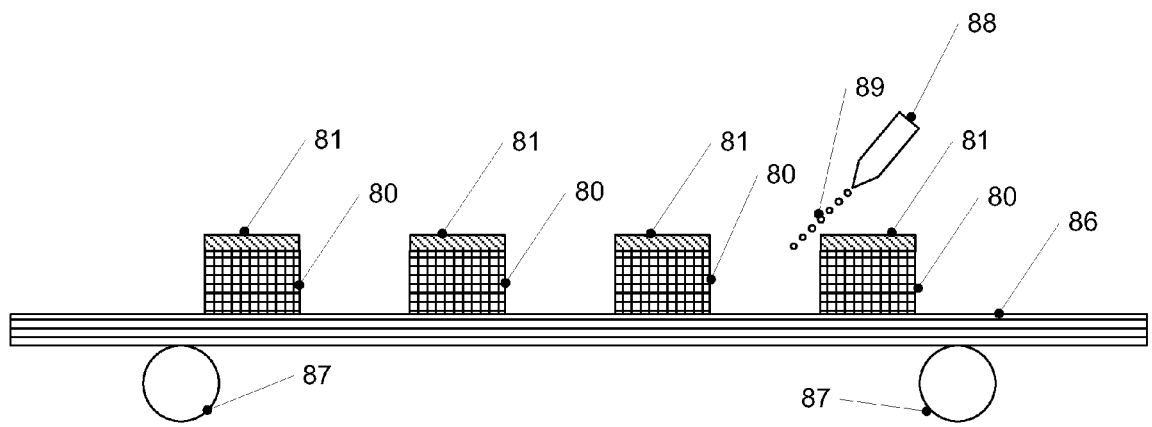

An example for such a material removal is shown in FIG. 8E. Here, a so-called $CO_2$ snow-jet 88 which emits a beam of frozen dry ice particles (i.e., frozen $CO_2$) 89 is used for material removal, resulting in metallized chip dies without overhanging metallization which are then ready for further processing, for example electrical contacting, packaging or the like.

The above-described embodiments serve merely as examples, and other implementations and embodiments are possible without departing from the scope of the present application.

What is claimed is:

1. A method comprising:
    partially dicing a substrate into a plurality of partially separate parts; and
    completely separating the partially separated parts from each other, wherein completely separating the partially separated parts comprises:
    mounting the substrate on an expansion tape; and
    expanding the expansion tape, wherein expanding the expansion tape comprises breaking bridges connecting the partially separated parts, and wherein the bridges comprise at least one of a semiconductor material or a metallization.

2. The method of claim 1, wherein the substrate comprises a semiconductor wafer.

3. The method of claim 2, wherein partially dicing comprises removing part of a material of the semiconductor wafer between the parts.

4. The method of claim 3, wherein the substrate further comprises a metallization on a side of the semiconductor wafer, the method further comprising removing the metallization between the parts prior to completely separating the partially separated parts.

5. The method of claim 2, wherein the substrate further comprises a metallization on a side of the semiconductor wafer, wherein the partially dicing comprises completely removing material of the semiconductor wafer between the parts such that after the partially dicing the parts are connected via the metallization.

6. The method of claim 2, wherein the parts comprise chip dies.

7. The method of claim 1, further comprising providing a metallization to a side of the substrate after partially dicing the substrate and prior to completely separating the parts.

8. The method of claim 1, further comprising removing excess material after completely separating.

9. The method of claim 8, wherein removing excess material comprises removing overhanging metal parts using a jet of dry ice.

10. The method of claim 1, wherein partially dicing the substrate comprises at least one of a plasma dicing or a mechanical sawing.

11. The method of claim 1, further comprising thinning the substrate after partially dicing the substrate.

12. The method of claim 1, wherein expanding the expansion tape comprises expansion tape in a direction essentially parallel to a surface of the substrate.

* * * * *